US006661833B1

(12) United States Patent
Black et al.

(10) Patent No.: US 6,661,833 B1
(45) Date of Patent: Dec. 9, 2003

(54) PN GENERATORS FOR SPREAD SPECTRUM COMMUNICATIONS SYSTEMS

(75) Inventors: Peter J. Black, San Diego, CA (US); Roberto Padovani, San Diego, CA (US); Lindsay A. Weaver, Jr., Boulder, CO (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 09/494,838

(22) Filed: Jan. 31, 2000

(51) Int. Cl.[7] .................................................. H04B 1/69
(52) U.S. Cl. ..................... 375/147; 370/335; 708/250
(58) Field of Search ............................... 375/130, 367, 375/147; 708/250; 370/335

(56) References Cited

U.S. PATENT DOCUMENTS

| | | | |
|---|---|---|---|
| 4,901,307 A | 2/1990 | Gilhousen et al. | 370/18 |
| 5,103,459 A | 4/1992 | Gilhousen et al. | 375/1 |
| 5,781,543 A | 7/1998 | Ault et al. | 370/342 |
| 5,790,589 A * | 8/1998 | Hutchison, IV et al. | 375/130 |
| 5,805,648 A | 9/1998 | Sutton | 375/367 |
| 5,903,554 A | 5/1999 | Saints | 370/342 |
| 6,430,170 B1 * | 8/2002 | Saints et al. | 370/335 |

OTHER PUBLICATIONS

Kim, et al. "I/Q Multiplexed Code Assignment for Fast Cell Search in Asynchronous DS/CDMA Cellular Systems," IEEE Communications Letters 2(6): 159–161 (Jun. 1998).

* cited by examiner

Primary Examiner—Temesghen Ghebretinsae
(74) Attorney, Agent, or Firm—Philip Wadsworth; Kent Baker; Byron Yafuso

(57) ABSTRACT

Techniques to improve the acquisition process in a spread spectrum environment. The signals from different CDMA systems are spread with different sets of PN sequences, with the PN sequences in each set being uncorrelated to the PN sequences in the other sets. By using uncorrelated PN sequences, the likelihood of detecting a pilot signal from an undesired system is reduced or minimized, and the mean time to acquisition of the pilot signal from the desired system is improved. The mobile station can attempt to acquire the pilot signal by processing the received signal with a first set of PN sequences corresponding to a first hypothesis of the particular signal being acquired. If acquisition of the pilot signal fails, a second set of PN sequences corresponding to a second hypothesis is selected and used to process the received signal. The PN sequences in the second set are uncorrelated to the PN sequences in the first set. The PN sequences for the first set can be generated based on the characteristic polynomials defined by IS-95-A, and the PN sequences for the second set can be the reverse of the PN sequences for the first set.

17 Claims, 7 Drawing Sheets

PN GENERATORS FOR SPREAD SPECTRUM COMMUNICATIONS SYSTEMS

BACKGROUND OF THE INVENTION

I. Field of the Invention

The present invention relates to wireless communications. More particularly, the present invention relates to pseudo-random number (PN) generators for spread spectrum communications systems.

II. Description of the Related Art

The use of code division multiple access (CDMA) modulation techniques is one of several techniques for facilitating communication in which a large number of system users are present. Although other multiple access communication system techniques are known in the art, such as time division multiple access (TDMA and GSM), frequency division multiple access (FDMA), and AM modulation schemes such as amplitude companded single sideband (ACSSB), the spread spectrum modulation technique of CDMA has significant advantages over these other modulation techniques for multiple access communications systems. The use of CDMA techniques in a multiple access communications system is disclosed in U.S. Pat. No. 4,901,307, issued Feb. 13, 1990, entitled "SPREAD SPECTRUM MULTIPLE ACCESS COMMUNICATION SYSTEM USING SATELLITE OR TERRESTRIAL REPEATERS" and U.S. Pat. No. 5,103,459, issued Apr. 7, 1992, entitled "SYSTEM AND METHOD FOR GENERATING SIGNAL WAVEFORMS IN A CDMA CELLULAR TELEPHONE SYSTEM," both assigned to the assignee of the present invention and incorporated herein by reference.

CDMA systems are typically designed to conform to a particular CDMA standard. Examples of such CDMA standards include the "TIA/EIA/IS-95-A Mobile Station-Base Station Compatibility Standard for Dual-Mode Wideband Spread Spectrum Cellular System" (hereinafter, the IS-95-A standard) and the TIA/EIA/IS-98-A, -B, and -C standards entitled "Recommended Minimum Performance Standard for Dual-Mode Spread Spectrum Cellular and PCS Mobile Stations."

CDMA systems are direct sequence spread spectrum systems that spectrally spread the transmitted data over an entire available system bandwidth with a set of inphase and quadrature pseudo-random noise (PN) sequences. The PN sequences are selected because of certain important "randomness" properties that provide superior performance. Each CDMA standard defines the specific PN sequences to be used for spreading the data.

In CDMA systems, a particular geographic area can be partitioned into a number of neighboring cells and each cell can be further partitioned into a number of sectors. Each cell or sector is serviced by a base station that communicates with a number of mobile stations located within or near the cell or sector coverage area. The forward link refers to transmissions from the base station to the mobile station and the reverse link refers to transmissions from the mobile station to the base station. The forward link and the reverse link are allocated separate frequencies.

For a CDMA system that conforms to the IS-95-A standard, each transmitting base station is assigned a particular offset of the PN sequences. Specifically, in accordance with the IS-95-A standard, the base stations are each assigned one of 512 possible offsets. The assigned offset allows the mobile station to identify each base station with which it communicates.

On the forward link, a pilot signal is typically transmitted by the base station and used by the mobile station for acquisition. For an IS-95-A compliant system, the pilot signal is simply a transmission of the PN sequences at the assigned offset. The pilot signal enables the mobile station to acquire a local base station in a timely manner. The mobile station also derives synchronization information and relative signal power information from the received pilot signal.

As demand for wireless communication increases, a geographic area may include multiple spread spectrum systems. For example, the geographic area may be simultaneously serviced by one CDMA system operated at a cellular frequency band and another CDMA system operated at a Personal Communications System (PCS) (or another) frequency band. The mobile station may be designed with the capability to acquire and communicate with one or more CDMA systems. During the acquisition process, if the base stations of these different CDMA systems transmit using similar PN sequences, the mobile station may not be able to easily distinguish the pilot signals from these systems. As a result, additional signal processing may be required to acquire and identify the desired system, which can prolong the acquisition process.

Thus, techniques that aid in the detection and acquisition of a particular CDMA system in a multiple systems environment are highly desirable.

SUMMARY OF THE INVENTION

The present invention provides techniques to improve the acquisition process in a spread spectrum environment in which a mobile station receives forward link spread spectrum signals from multiple CDMA systems or in which the mobile station does not have a priori knowledge of the source of the received signal. In accordance with the invention, the spread spectrum signals from different CDMA systems are spread with different sets of PN sequences, with the PN sequences from each set being uncorrelated to the PN sequences in the other sets. By using uncorrelated PN sequences, the likelihood of detecting a pilot signal from an undesired system is reduced or minimized, and the mean time to acquisition of the pilot signal from the desired system is improved.

An embodiment of the invention provides a method for acquiring a particular one of a number of spread spectrum signals, with the particular spread spectrum signal being spread with a particular set of PN sequences. In accordance with the method, a first set of PN sequences is identified and corresponds to a first hypothesis of the particular spread spectrum signal being acquired. A received signal is then processed with the identified set of PN sequences to extract a pilot signal. A metric is computed for the extracted pilot signal and used to determine whether the pilot signal has been acquired. If the pilot signal is determined to not be acquired, a second set of PN sequences corresponding to a second hypothesis of the particular spread spectrum signal is selected and used to process the received signal. The PN sequences in the second set are uncorrelated to the PN sequences in the first set.

In a specific implementation, the PN sequences in the second set are the reverse of the PN sequences in the first set. The PN sequences in the first set can be generated based on the characteristic polynomials defined by the IS-95-A standard.

Another embodiment of the invention provides a method for a receiver unit configurable to acquire a particular one of a number of spread spectrum signals. The receiver unit includes a receiver, a demodulator, a despreader, a PN generator, a processing unit, and a controller. The receiver receives and conditions a received signal, which includes the particular spread spectrum signal, to provide a conditioned signal. The demodulator demodulates the conditioned signal to provide baseband signals, and the despreader despreads the baseband signals with a first set of PN sequences to provide despread signals. The PN generator provides the first set of PN sequences, which is selected from among a number of sets of PN sequences and corresponds to a first hypothesis of the particular spread spectrum signal being acquired. The processing unit processes the despread signals to extract a pilot signal and computes a metric for the extracted pilot signal. The controller determines whether the pilot signal has been acquired based, in part, on the computed metric. If the pilot signal is determined to not be acquired, the controller directs the PN generator to provide a second set of PN sequences corresponding to a second hypothesis of the particular spread spectrum signal being acquired. The PN sequences in the second set are uncorrelated to the PN sequences in the first set.

Again, in a specific implementation, the PN sequences in the second set are the reverse of the PN sequences in the first set. The PN sequences for the first set can also be generated based on the characteristic polynomials defined by the IS-95-A standard.

Yet another embodiment of the invention provides a transmitter that includes a spreader, a PN generator, a modulator, and a transmitter. The spreader receives and spreads pilot data with a set of PN sequences to provide spread pilot data. The PN generator provides the set of PN sequences, which is generated based on the following characteristic polynomials:

$$P_{1,2}=x^{15}+x^{10}+x^8+x^7+x^6+x^2+1, \text{ and}$$

$$P_{Q,2}=x^{15}+x^{12}+x^{11}+x^{10}+x^9+x^5+x^4+x^3+1.$$

The modulator modulates the spread pilot data to provide a modulated signal, and the transmitter receives and conditions the modulated signal to provide a spread spectrum signal. The pilot data can be gated.

BRIEF DESCRIPTION OF THE DRAWINGS

The features, nature, and advantages of the present invention will become more apparent from the detailed description set forth below when taken in conjunction with the drawings in which like reference characters identify correspondingly throughout and wherein.

DETAILED DESCRIPTION OF THE SPECIFIC EMBODIMENTS

Figure 1:
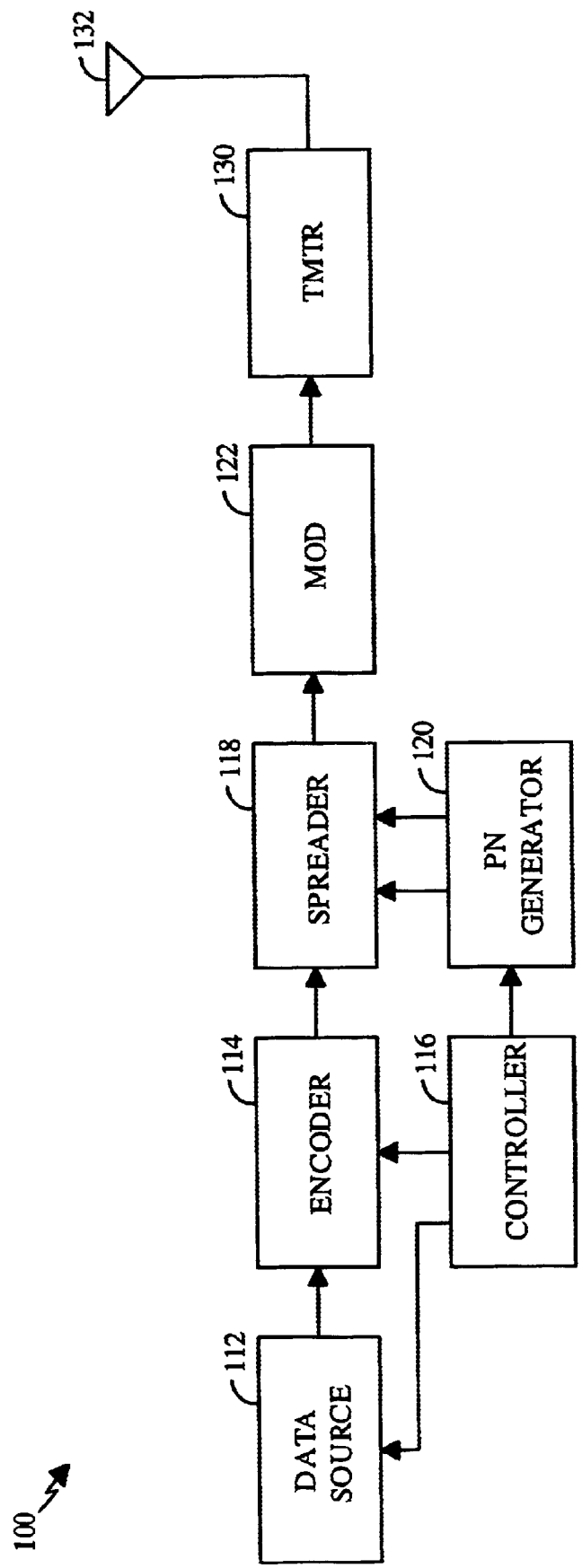
FIG. 1 shows a block diagram of a specific embodiment of a transmitter unit that generates a spread spectrum signal in a CDMA communications system.

FIG. 1 shows a block diagram of a specific embodiment of a transmitter unit 100 that generates a spread spectrum signal in a CDMA communications system. Within transmitter unit 100, data from a data source 112 is partitioned into data frames and provided to an encoder 114. A controller 116 can direct the partition and transfer of data from data source 112, and can also provide additional data and messages to encoder 114. Encoder 114 encodes the received data and messages in accordance with a particular encoding format and provides the encoded data to a spreader 118. Spreader 118 also receives a set of pseudo-random noise (PN) sequences from a PN generator 120, and spectrally spreads the encoded data and messages with the PN sequences to generate spread data. The spread data is provided to a modulator (MOD) 122 that modulates the data with an intermediate frequency carrier signal (IF_LO) in accordance with a particular modulation format (e.g., QPSK or OQPSK) to generate an IF modulated signal.

The IF modulated signal is provided to a transmitter (TMTR) 130 that buffers and amplifies the signal, upconverts the signal to a radio frequency (RF), and filters and amplifies the RF signal to generate an RF modulated signal. The RF modulated signal is then routed through an isolator and a duplexer and transmitted as a spread spectrum signal via an antenna 132. Some of the elements in FIG. 1 are described in more detail below.

Transmitter unit 100 can be designed to implement a particular code division multiple access (CDMA) standard. For example, transmitter unit 100 can be designed to conform to: (1) the "TIA/EIA/IS-95-A Mobile Station-Base Station Compatibility Standard for Dual-Mode Wideband Spread Spectrum Cellular System," (2) the TIA/EIA/IS-98-A, -B, and -C entitled "Recommended Minimum Performance Standard for Dual-Mode Spread Spectrum Cellular and PCS Mobile Stations," (3) "The cdma2000 ITU-R RTT Candidate Submission," or (4) "The ETSI UMTS Terrestrial Radio Access (UTRA) ITU-R RTT Candidate Submission," which are herein referred to as the IS-95-A standard, the IS-98 standard, the IS-2000 standard or submission, and the WCDMA standard or submission, respectively. These standards are incorporated herein by reference.

Transmitter unit 100 can also be designed to implement a particular CDMA architecture that is not yet defined by a standard, such as the CDMA system described in U.S. patent application Ser. No. 08/963,386, now U.S. Pat. No. 6,574,211, issued Jun. 3, 2003 to Padovani et al., entitled "METHOD AND APPARATUS FOR HIGH RATE PACKET DATA TRANSMISSION," assigned to the assignee of the present invention, and incorporated herein by reference.

Figure 2:
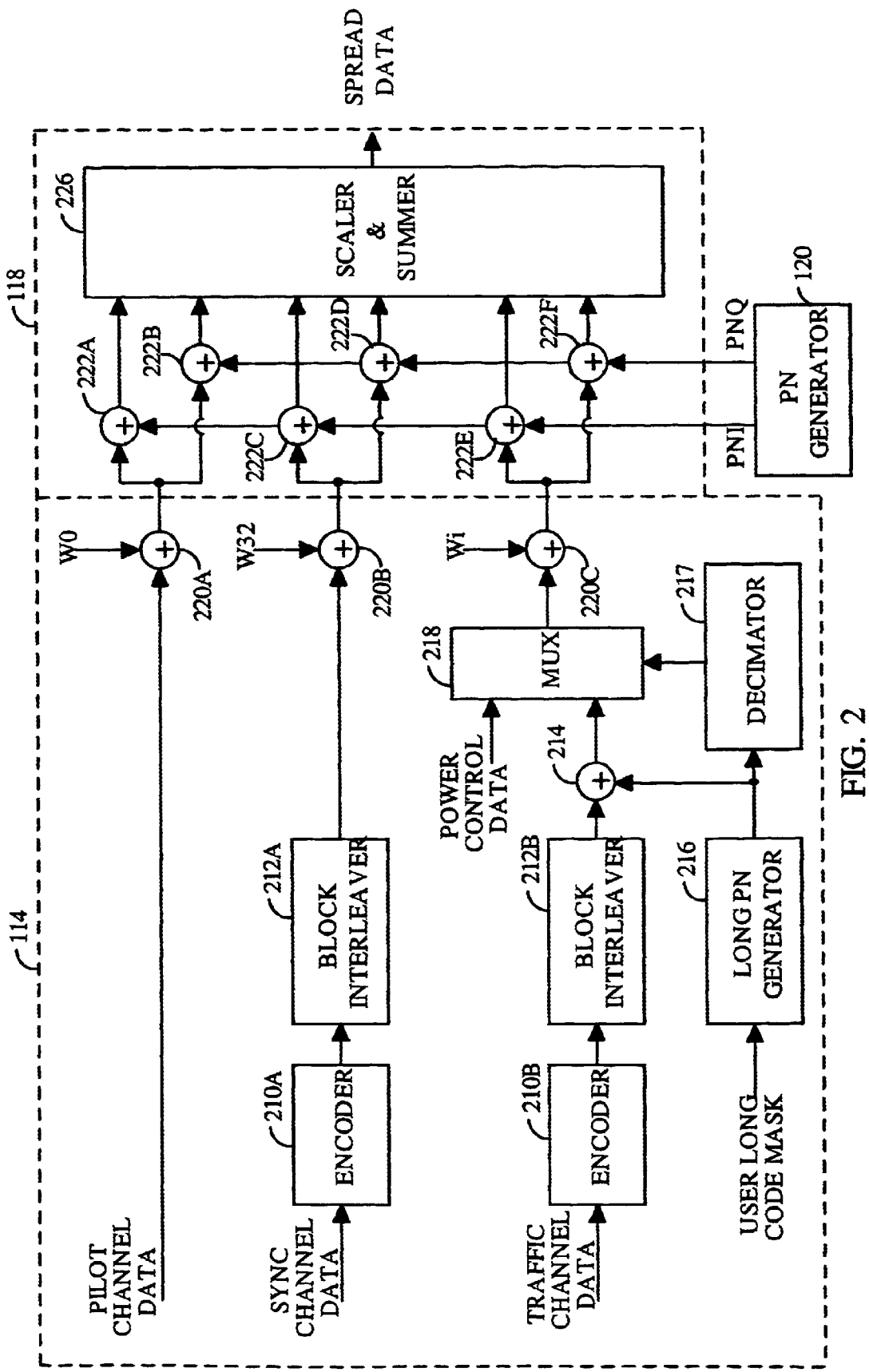
FIG. 2 shows a more detailed block diagram of an embodiment of an encoder and a spreader for a transmitter unit that conforms to the IS-95-A standard.

FIG. 2 shows a more detailed block diagram of an embodiment of encoder 114 and spreader 118 for a transmitter unit that conforms to the IS-95-A standard. The pilot channel data is provided to a channel cover element 220a that covers the data with Walsh code 0 (i.e., the 64-bit all zeros sequence). In accordance with the IS-95-A standard, the pilot channel data is a sequence of all zeros, and the covered pilot data is also a sequence of all zeros. The covered pilot data is then provided to spreaders 222a and 222b that also receive the inphase PN sequence (PNI) and the quadrature PN sequence (PNQ), respectively. Each spreader 222 spreads the received data with the respective PN sequence and provides the spread data to a scaler and summer 226.

The synchronization (sync) channel data is provided to an encoder 210a that encodes the data with a particular encoding format. In accordance with the IS-95-A standard, encoder 210a generates and appends a set of cyclic redundancy check (CRC) bits, appends a set of code tail bits, convolutionally encodes the data and appended bits to generate code symbols, and repeats the symbols to provide encoded data having a particular symbol rate. The encoded data is provided to a block interleaver 212a that reorders the symbols using a particular ordering format. The interleaved data is provided to a channel cover element 220b that covers the data with Walsh code 32 (i.e., the 64-bit sequence comprised of 32 zeros followed by 32 ones). The covered sync data is provided to spreaders 222c and 222d that spread the sync data with the inphase and quadrature PN sequences, respectively, and provide the spread data to scaler and summer 226.

The traffic channel data (i.e., for data communication) is provided to an encoder 210b that encodes the data with a particular encoding format. Encoder 210b generates and appends a set of CRC bits, appends a set of code tail bits, encodes the data and appended bits with a particular convolutional code that may be selected based on the data rate, and repeats the code symbols to provide encoded data having a particular symbol rate. The encoded data is provided to a block interleaver 212b that reorders the symbols using a particular ordering format and provides the interleaved data to a scrambler 214. Scrambler 214 also receives a long PN sequence from a long PN generator 216 and scrambles the data with the long PN sequence to generate scrambled data. A multiplexer (MUX) 218 receives the scrambled data and the power control data, selects either the scrambled or power control data depending on a control signal from a decimator 217, and provides the selected data to a channel cover element 220c.

Channel cover element 220c covers the data with a particular Walsh code Wi assigned to the communication with a particular mobile station. The covered traffic data is provided to spreaders 222e and 222f that spread the received data with the inphase and quadrature PN sequences, respectively, and provide the spread data to scaler and summer 226. Scaler and summer 226 also receives the spread data for the other traffic channels, scales each traffic channel data in accordance with a power control mechanism, and combines the pilot, sync, and scaled traffic data to provide a resultant spread data.

In FIG. 2, since the data, PN sequences, and Walsh sequences each comprise one bit of resolution, channel cover elements 220, spreaders 222, and scrambler 214 can each be implemented with a modulo-2 adder (e.g., an exclusive-OR gate).

Figure 3:
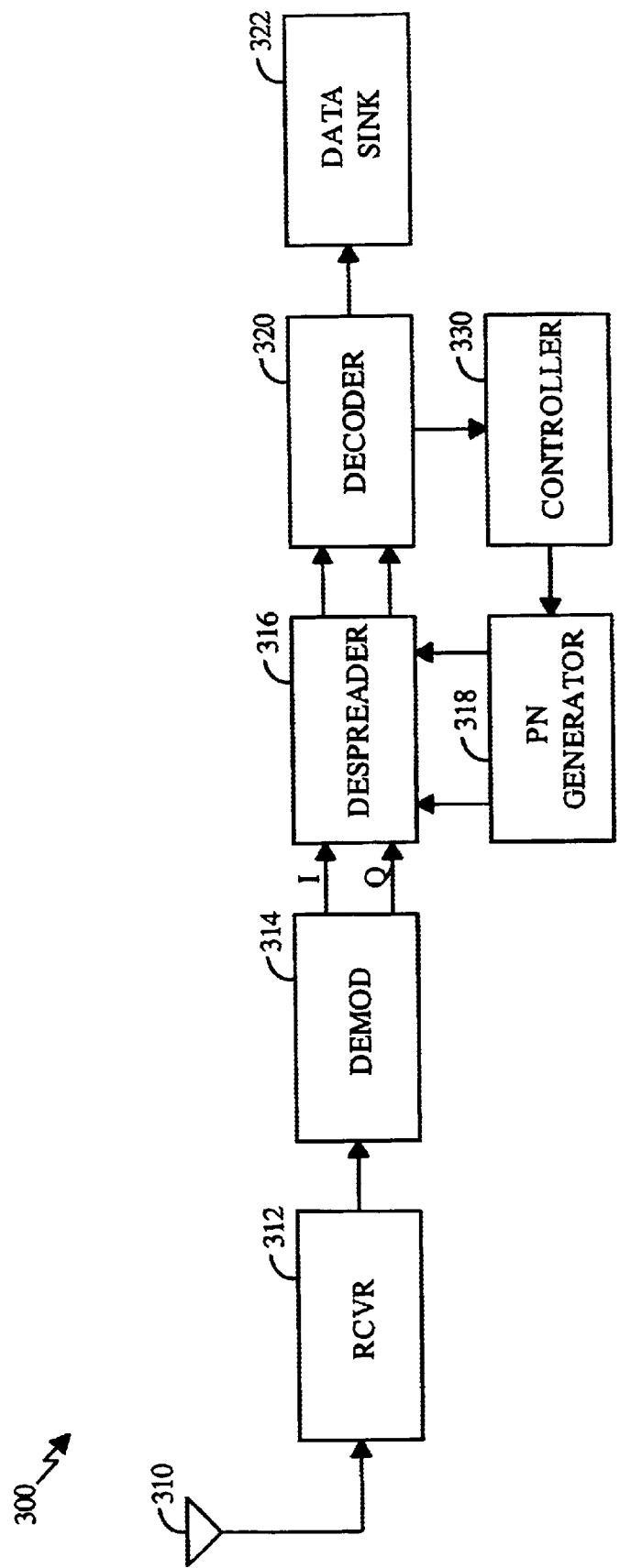
FIG. 3 shows a block diagram of a specific embodiment of a receiver unit that receives and processes a spread spectrum signal.

FIG. 3 shows a block diagram of a specific embodiment of a receiver unit 300 that receives and processes a spread spectrum signal. The signal is received by an antenna 310 and provided to a receiver (RCVR) 312 that amplifies, filters, and downconverts the signal. The resultant intermediate frequency (IF) modulated signal is provided to a demodulator (DEMOD) 314 that demodulates the signal using a demodulation format (e.g., QPSK or OQPSK) complementary to the modulation format used at the transmitting source. The demodulated inphase (I) and quadrature (Q) data is provided to a despreader 316 that despreads the data with the inphase and quadrature PN sequences from a PN generator 318. The despread data is provided to a decoder 320 that decodes the data with a decoding scheme complementary to the encoding scheme performed at the transmitting source. The decoded data is provided to a data sink 322. A controller 330 receives the decoded data and other information from decoder 320 and directs the operation of PN generator 318.

Figure 4:
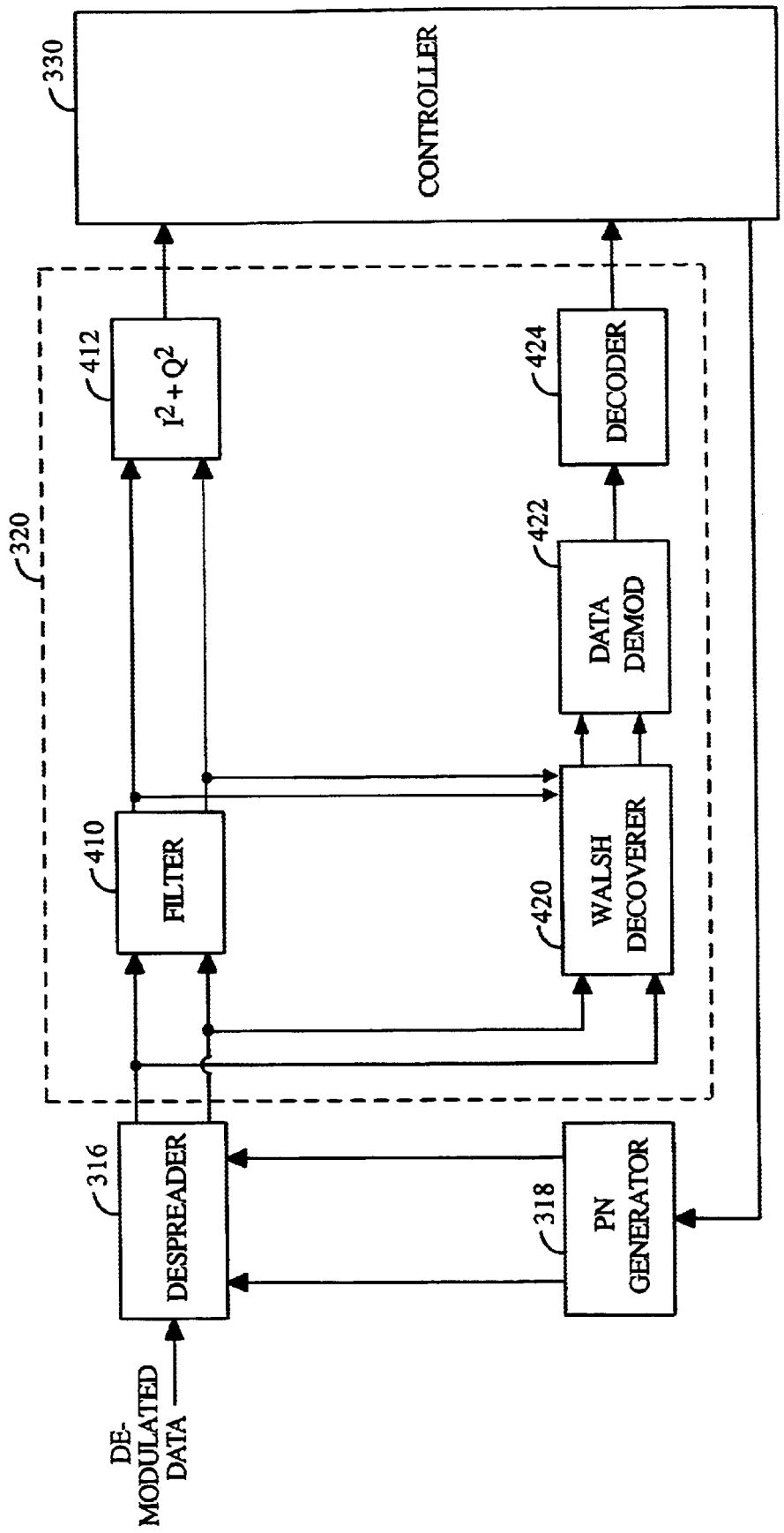
FIG. 4 shows a block diagram of an embodiment of the decoder within the receiver unit.

FIG. 4 shows a block diagram of an embodiment of decoder 320. To recover the pilot data, the despread data from despreader 316 is provided to a filter 410 that accumulates each of the demodulated I and Q data over a particular time period consistent with the coherence of the channel. The filtered I and Q data is then provided to an element 412 that squares each of the I and Q data and sums the squared data. The output from element 412 is an estimate of pilot strength ($E_C/I_O$) and is provided to controller 330.

Controller 330 computes a metric for the pilot data. In an embodiment, controller 330 computes the energy of the pilot signal by summing the squared data over a particular time interval (e.g., 64 data values). Computation of the pilot energy is described in U.S. Pat. No. 5,805,648, issued Sep. 8, 1998, entitled "METHOD AND APPARATUS FOR PERFORMING SEARCH ACQUISITION IN A CDMA COMMUNICATION SYSTEM" and U.S. Pat. No. 5,903,554, issued May 11, 1999, entitled "METHOD AND APPARATUS FOR MEASURING LINK QUALITY IN A SPREAD SPECTRUM COMMUNICATION SYSTEM," both assigned to the assignee of the present invention and incorporated herein by reference. The elements (e.g., filter 410, element 412, and portion of controller 330) that process the despread data to provide a computed metric (e.g., a computed pilot energy measurement) are collectively referred to as a processing unit.

The demodulated I and Q data is also provided to a Walsh decoverer 420 that decovers the data with a particular Walsh code corresponding to the sync or traffic channel being processed. The decovered data is provided to data demodulator 422, which also receives the filtered I and Q data from filter 410. The filtered I and Q data is used as a phase and amplitude reference in the data demodulation. The output of data demodulator 422 is then provided to a decoder 424 that decodes the data in a manner complementary to the encoding performed at the transmitting source. Specifically, decoder 424 reorders the decovered data, convolutionally decodes the reordered data (e.g., using a Viterbi decoder), and checks the decoded data with the CRC bits. The decoded data is provided to controller 330.

The pilot channel is processed and used by the mobile station to extract timing information and to determine the quality of the forward link. Upon power up or when transferring from another communications system (e.g., an analog system or another CDMA system), the mobile station transitions into an initialization state whereby it searches for transmissions from one or more base stations. An initialized mobile station is then ready to receive or initiate communication with the acquired base station(s).

Figure 5:
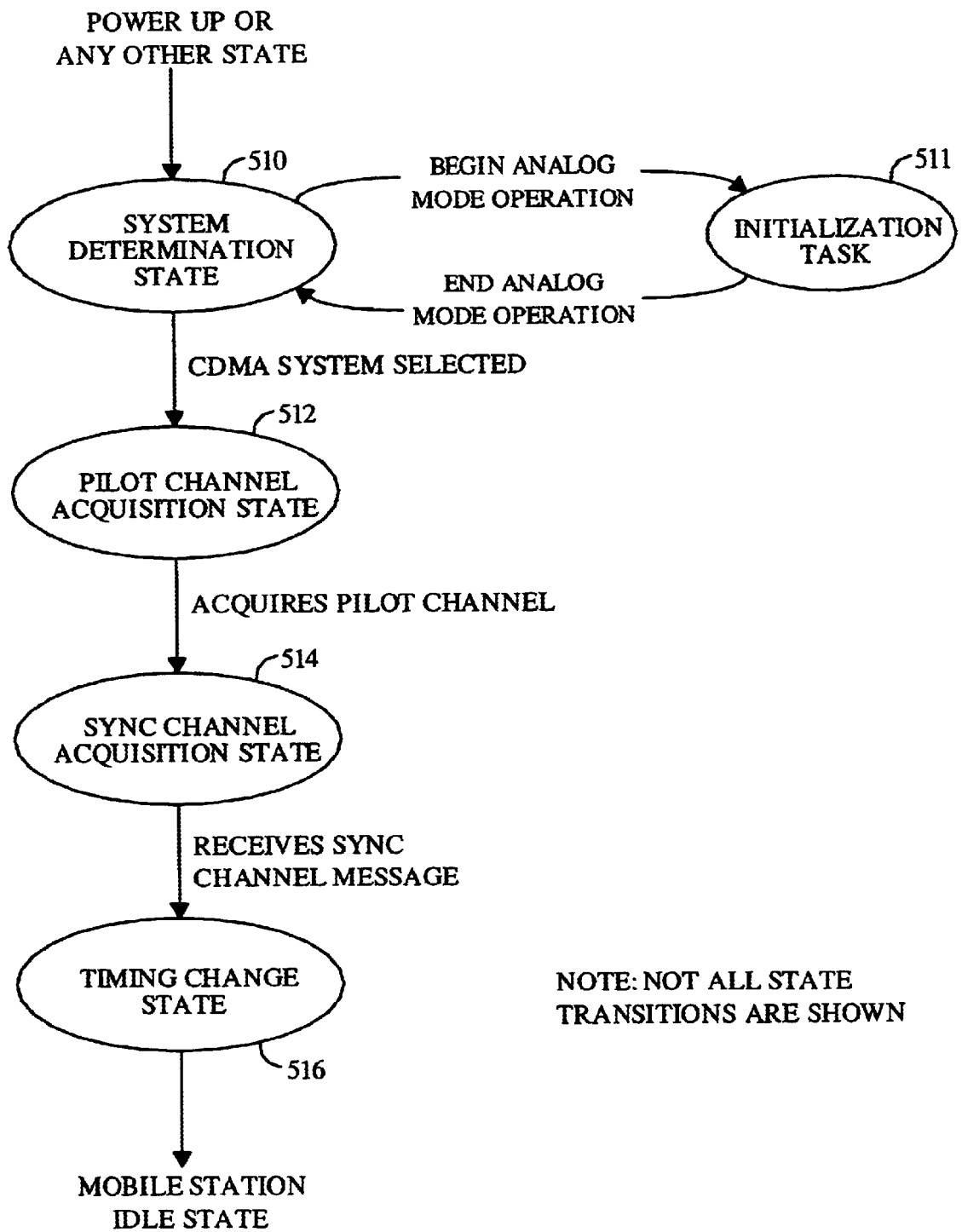
FIG. 5 shows a flow diagram of an embodiment of the acquisition process for the mobile station.

FIG. 5 shows a flow diagram of an embodiment of the acquisition process for the mobile station. The acquisition process is performed when the mobile station is in the initialization state. Upon power up or from another operating state, the mobile station enters a system determination state 510. In system determination state 510, the mobile station selects a particular CDMA system to use and sets a channel field $CDMACH_s$ to either a primary or secondary CDMA channel number. Alternatively, the mobile station can select to operate in another type of system (e.g., an analog system) and transitions to an initialization task state 511. If a CDMA system is selected, the mobile station enters a pilot channel acquisition state 512.

In pilot channel acquisition state 512, the mobile station attempts to acquire the pilot channel of the selected CDMA system. The mobile station tunes to the CDMA channel number identified in the channel field $CDMACH_s$, sets its channel code for the pilot channel, and searches for the pilot signal. If the mobile station successfully acquires the pilot channel within a first particular time period T1, it enters a sync channel acquisition state 514. Otherwise, if the mobile station fails to acquire the pilot channel within the time period T1, it returns to system determination state 510.

In sync channel acquisition state 514, the mobile station receives and processes a sync channel message on the sync channel to obtain system configuration and timing information. If the mobile station receives a valid sync channel message within a second particular time period T2 and the protocol revision level supported by the mobile station is greater than or equal to the minimum protocol revision level supported by the base station, the mobile station extracts and stores a set of information from the sync channel message. The mobile station then enters a timing change state 516.

In timing change state 516, the mobile station synchronizes its long PN code timing and system timing to those of the acquired CDMA system. This timing synchronization is performed using the information extracted from the received sync channel message. The mobile station also initializes other internal registers and enters a mobile station idle state (not shown in FIG. 5). The mobile station then awaits a communication with the acquired base station.

Back in sync channel acquisition state 514, if the mobile station does not receive a valid sync channel message within the time period T2, the mobile station returns to system determination state 510. Also, if the mobile station receives a valid sync channel within the time period T2 but the protocol revision level supported by the mobile station is less than the minimum protocol revision level supported by the base station, the mobile station also returns to system determination state 510.

If the mobile station returns to system determination state 510 because of failure to acquire either the pilot channel or the sync channel, the mobile station sets the channel field $CDMACH_s$ to the alternate channel number (e.g., primary or secondary) and attempts to acquire on the alternate CDMA channel. The mobile station may perform several attempts to acquire either the primary or secondary channel before performing the system selection process. The acquisition process is further described in the IS-95-A standard.

The pilot signal is used to synchronize the mobile station in PN phase and frequency to the transmissions from the base station. Acquisition of the pilot signal is performed by a "searcher" that includes hardware for both phase and frequency tracking and is located within the receiver unit. Initially, the mobile station sets its frequency close to the frequency of the pilot signal. The searcher then acquires the phase of the received signal and thereafter acquires the frequency of the signal.

To determine the phase of the received pilot signal, a particular subset of phases is selected from the set of all possible phase offsets and tested. The selected subset of phase offsets is referred to as a window. The mobile station determines whether any of the phase offsets in the window is synchronized with the phase offset of the received signal.

A method and apparatus for acquiring a pilot signal in a CDMA communications system is disclosed in the afore-mentioned U.S. Pat. No. 5,805,648. In accordance with the disclosed method, a particular PN offset from the window is selected and the PN generator is set to this offset. The received signal is despread with the PN sequences having the selected offset and the energy of the pilot is computed over a particular time interval (i.e., over a particular number of PN chips). If the computed energy exceeds a detection threshold, the PN offset is scanned a particular number of times and the pilot energy is computed for each scan. If the computed energy for all scans exceeds a validation threshold, the pilot channel is identified as being successfully acquired.

Otherwise, if the computed energy for the particular PN offset is below the detection threshold during the initial scan, or if the computed energy is below the validation threshold during the rescans, another PN offset in the window is selected and tested. If all PN offsets for the window fail, another window of possible PN offsets is selected and scanned. If all windows are scanned and the pilot channel is still not acquired, the search criteria may be modified and the acquisition process may be repeated. For example, the window size, the number of chips to non-coherently accumulate, and the number of times to coherently accumulate can be modified.

In spread spectrum communications systems, the PN sequences are carefully selected to have certain important "randomness" properties. Some of these properties are classified as follows:

R-1: Relative frequencies of zeros ("0") and ones ("1") are each 50 percents.

R-2: Run lengths (of, 0's and 1's) are as expected in a coin-flipping experiment. Half of all run lengths are unity (i.e., a single one or a single zero), one quarter are of length two, one-eight are of length three, and so on. A fraction $\frac{1}{2}^n$ of all runs are of length n for all finite n.

R-3: If the random sequence is shifted by any non-zero number of elements, the resulting sequence will have an equal number of agreements and disagreements with the original sequence.

The IS-95-A standard defines a specific set of PN sequences for use in spreading the data prior to transmission. The inphase and quadrature PN sequences each has a length of $2^{15}$ (i.e., 32,768 PN chips in length), and are generated based on the following characteristic polynomials:

$$P_{I,1} = x^{15} + x^{13} + x^9 + x^8 + x^7 + x^5 + 1, \text{ and} \tag{1}$$

$$P_{Q,1} = x^{15} + x^{12} + x^{11} + x^{10} + x^6 + x^5 + x^4 + x^3 + 1. \tag{2}$$

Figure 6A:
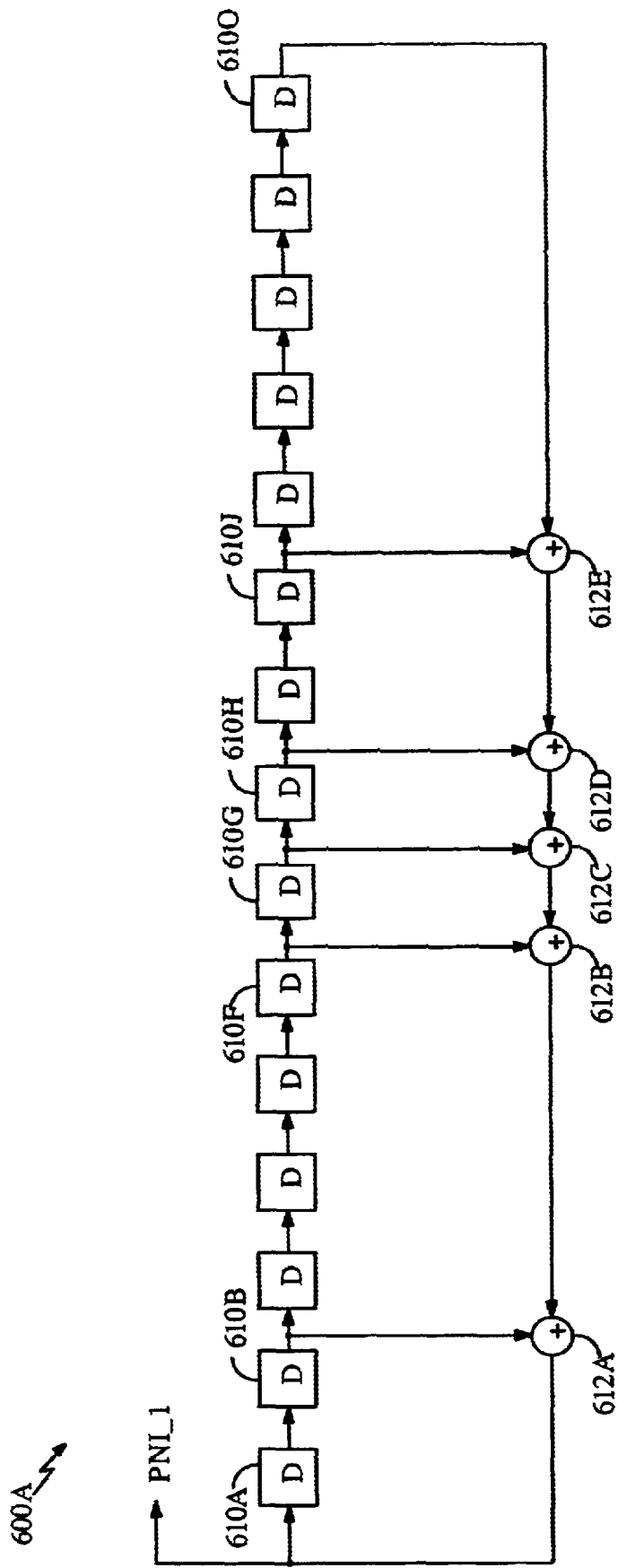
FIG. 6A shows a block diagram of an embodiment of a PN generator for generating an inphase PN sequence in accordance with the characteristic polynomial defined by the IS-95-A standard.

FIG. 6A shows a block diagram of an embodiment of a PN generator 600a for generating the inphase PN sequence in accordance with the characteristic polynomial shown in equation (1). PN generator 600a includes a number of delay elements 610a through 610o coupled in cascade. Delay elements 610 are initialized with a set of values based on the desired PN offset. The outputs from delay elements 610b, 610f, 610g, 610h, and 610j are provided to modulo-2 adders 612a through 612e, respectively. Adders 612a through 612e also receive the outputs from adders 612b through 612e and delay element 610o, respectively. Each adder 612 performs a modulo-2 addition of the two inputs and provides the result to its output. The output from adder 612a is provided to delay element 610a.

The PNI_1 sequence from PN generator 600a has a length of $2^{15}$_1 (i.e., 32,767) and approximately provides the "randomness" properties described above. An additional zero (0) is inserted into the PNI_1 sequence whenever 14 consecutive zeros are detected. With the additional zero, the output PN sequence provides the properties noted above, for $n \leq 15$. A similar PN generator can be used to generate the quadrature PN sequence in accordance with the characteristic polynomial shown in equation (2).

The PN sequences defined by the IS-95-A standard have the desired "randomness" properties listed above and provide superior performance in a spread spectrum system. Moreover, these PN sequences have been time tested from years of use. Consequently, newer CDMA systems and standards are influenced into adopting the same PN sequences defined by the IS-95-A standard.

However, when multiple CDMA systems are operated within a particular geographic area and these systems use the same set of PN sequences for spreading, the acquisition of the pilot channel for these systems can be made more challenging. The mobile station receives a composite signal that is a combination of the spread spectrum signals from all transmitting base stations for these various CDMA systems. The mobile station selects one of the systems to acquire and processes the received signal using the PN sequences corresponding to the selected system. During the acquisition process, the mobile station despreads the received signal at various offsets of the selected PN sequences and computes the pilot energy for these various offsets.

If multiple CDMA systems use the same PN sequences for spreading the pilot data, the mobile station may not be able to efficiently determine the system to which the detected pilot signal belongs. As a result, the mobile station may often falsely detect a pilot signal (i.e., indicating that the pilot channel for the desired system has been acquired when in fact the acquired pilot channel is from an undesired system). When attempting to acquire a particular CDMA system, a detected pilot signal from an undesired system can cause the mobile station to advance to the next operating state whereby a sync channel is processed to acquire a sync channel message. The mobile station will realize from the sync channel message that an undesired spread spectrum signal has been acquired and return to the pilot acquisition operating state. Repeated false detection of the pilot signal and acquisition of the sync channel message can prolong the acquisition process, thereby degrading the performance of the mobile station.

In an embodiment, the PN sequences for a co-sited spread spectrum system are selected to be uncorrelated to the PN sequences of other spread spectrum systems operating in the geographic area. The use of a set of uncorrelated PN sequences reduces or minimizes the number of false detections of the pilot signal, which can speed up the acquisition process.

The improvement in acquisition can be illustrated by an example in which two CDMA systems are operating within a particular coverage area. In the first scenario, both CDMA systems use the same set of PN sequences (e.g., the PN sequences defined by the IS-95-A standard) to spread the pilot and traffic data. During the acquisition process, the mobile station uses the same set of PN sequences, computes the pilot energy at various PN offsets, and determines whether the pilot signal has been acquired based on the computed pilot energy. The mobile station is not able to determine which CDMA system is acquired, or whether the acquired system is the desired system, unless it performs additional signal processing such as acquisition of the sync channel message. As can be seen, false detection of the pilot signal of a first CDMA system when attempting to acquire the pilot signal of a second CDMA system can prolong the acquisition process.

In the second scenario, each CDMA system uses a different set of PN sequences that are uncorrelated to the PN sequences of other CDMA systems. During the acquisition process, the mobile station selects the set of PN sequences corresponding to the desired CDMA system. If multiple systems are transmitting, the mobile station can search for only the signal from the desired system since the pilot signals of the other systems are not correlated to the selected set of PN sequences and will likely not be detected. This avoids the false detection of the pilot signals from the undesired systems.

In an embodiment, the PN sequences for the alternative CDMA system are selected to be uncorrelated to the PN sequences for the co-sited (e.g., IS-95-A compliant) CDMA system. In an embodiment, the PN sequences for the alternative CDMA system are selected to be the reverse (timewise) of the PN sequences defined by IS-95-A. The uncorrelated PN sequences have a length of $2^{15}$ (i.e., 32,768 PN chips in length), and are generated based on the following characteristic polynomials:

$$P_{1,2} = x^{15} + x^{10} + x^8 + x^7 + x^6 + x^2 + 1, \text{ and} \quad (3)$$

$$P_{Q,2} = x^{15} + x^{12} + x^{11} + x^{10} + x^9 + x^5 + x^4 + x^3 + 1. \quad (4)$$

Figure 6B:
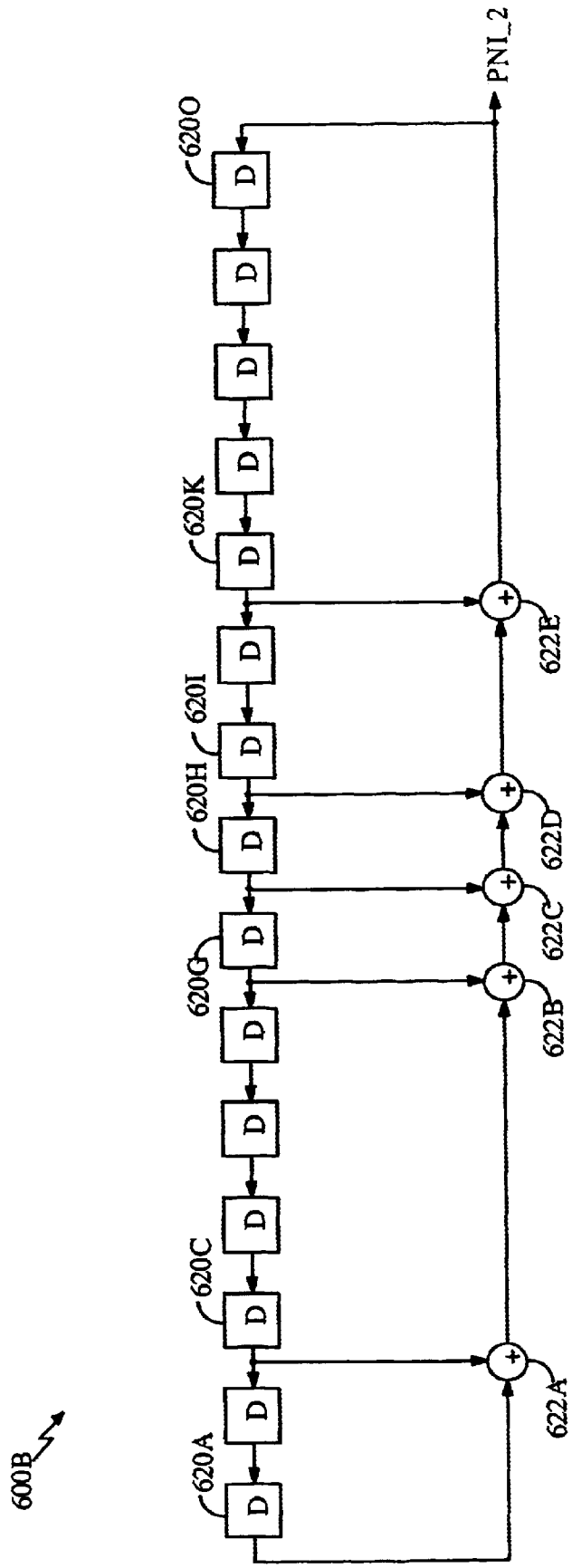
FIG. 6B shows a block diagram of an embodiment of a PN generator for generating an inphase PN sequence that is the reverse of the PN sequence generated in FIG. 6A.

FIG. 6B shows a block diagram of an embodiment of a PN generator 600*b* for generating the inphase PN sequence in accordance with the characteristic polynomial shown in equation (3). PN generator 600*b* includes a number of delay elements 620*a* through 620*o* coupled in cascade. Delay elements 620 are initialized with a set of values based on the desired PN offset. The outputs from delay elements 620*c*, 620*g*, 620*h*, 620*i*, and 620*k* are provided to modulo-2 adders 622*a* through 622*e*, respectively. Adders 622*a* through 622*e* also receive the outputs from delay element 620*a* and adders 622*a* through 622*d*, respectively. Each adder 622 performs a modulo-2 addition of the two inputs and provides the result to its output. The output from adder 622*a* is provided to delay element 620*o*.

The PNI_2 sequence from PN generator 600*b* has a length of $2^{15}-1$ (i.e., 32,767) and approximately provides the "randomness" properties described above. An additional zero (0) is inserted into the PNI_2 sequence whenever 14 consecutive zeros are detected. With the additional zero, the output PN sequence provides the randomness properties noted above.

Since the PNI_2 sequence generated by PN generator 600*b* is reverse (timewise) to the PNI_1 sequence generated by PN generator 600*a*, the PNI_2 sequence also enjoys the time-tested randomness properties of the PNI_1 sequence, and can be readily adopted for use in a new spread spectrum system with minimal design risk.

In a specific embodiment, the PN sequences are generated and stored in a memory unit within the mobile station. The mobile station also maintains a counter for addressing the memory unit. The first set of PN sequences can be retrieved from the memory unit by operating the counter in a first direction (e.g., counting upward) and the second set of PN sequences can be retrieved from the memory unit by operating the counter in a second direction (e.g., counting downward).

If the mobile station is attempting to acquire a CDMA system and has no priori knowledge of which CDMA systems, if any, are available, the mobile station can select a set of PN sequences corresponding to a particular hypothesis of the spread spectrum signal being acquired. For example, the mobile station can initially guess that the received signal is an IS-95-A compliant signal and select the set of PN sequences corresponding to this hypothesis. If acquisition fails with this selected set of PN sequences, the mobile station can select another set of PN sequences corresponding to another hypothesis (i.e., an alternative CDMA system). The process can continue (or repeat) until a desired system or no systems are detected.

The elements in the receiver unit (and the transmitter unit) described above can be implemented in various manners. These elements can be implemented in one or more integrated circuits, an application-specific integrated circuit (ASIC), a digital signal processor (DSP), a controller, a microprocessor, other circuits and/or software designed to perform the functions described herein, or a combination thereof. In some embodiments, the memory unit for storing the PN sequences can be implemented as a random access memory (RAM), a dynamic RAM (DRAM), a FLASH memory, a read-only memory (ROM), a programmable ROM (PROM), an electrically programmable ROM (EPROM), an electrically erasable PROM (EEPROM), and other memory technologies.

The invention described herein can be applied to many spread spectrum communications systems. The invention is applicable to CDMA systems that currently exist and new systems that are continually being considered. A specific CDMA system is described in the aforementioned U.S. patent application Ser. No. 08/963,386. Another CDMA system is disclosed in the aforementioned U.S. Pat. Nos. 4,901,307 and 5,103,459. The invention can provide improved acquisition performance by the mobile station in the spread spectrum system.

The foregoing description of the preferred embodiments is provided to enable any person skilled in the art to make or use the present invention. Various modifications to these embodiments will be readily apparent to those skilled in the art, and the generic principles defined herein may be applied to other embodiments without the use of the inventive faculty. Thus, the present invention is not intended to be limited to the embodiments shown herein but is to be accorded the widest scope consistent with the principles and novel features disclosed herein.

What is claimed is:

1. A method for acquiring a particular one of a plurality of spread spectrum signals, wherein the particular spread spectrum signal is spread with a particular set of pseudo-random noise (PN) sequences, the method comprising:
   identifying a first set of PN sequences corresponding to a first hypothesis of the particular spread spectrum signal being acquired;
   processing a received signal with the identified set of PN sequences to extract a pilot signal;
   computing a metric for the extracted pilot signal;
   determining whether the pilot signal has been acquired based, in part, on the computed metric; and
   if the pilot signal is determined to not be acquired,
      selecting a second set of PN sequences corresponding to a second hypothesis of the particular spread spectrum signal being acquired, wherein the PN sequences in the second set are uncorrelated to the PN sequences in the first set, and
      repeating the processing, computing, and determining steps.

2. The method of claim 1, wherein the PN sequences for the second set are the reverse of the PN sequences for the first set.

3. The method of claim 2, wherein the PN sequences for the first set are stored in a memory unit, the method further comprising:

accessing the memory unit in a first direction to retrieve the PN sequences for the first set; and
accessing the memory unit in a second direction to retrieve the PN sequences for the second set.

4. The method of claim 1, wherein the PN sequences for the first set are generated based on the following characteristic polynomials:

$$P_{1,1} = x^{15} + x^{13} + x^9 + x^8 + x^7 + x^5 + 1, \text{ and}$$
$$P_{Q,1} = x^{15} + x^{12} + x^{11} + x^{10} + x^6 + x^5 + x^4 + x^3 + 1.$$

5. The method of claim 4, wherein the PN sequences for the second set are generated based on the following characteristic polynomials:

$$P_{1,2} = x^{15} + x^{10} + x^8 + x^7 + x^6 + x^2 + 1, \text{ and}$$
$$P_{Q,2} = x^{15} + x^{12} + x^{11} + x^{10} + x^9 + x^5 + x^4 + x^3 + 1.$$

6. The method of claim 1, wherein the PN sequences for the first and second sets each has a length of $2^{15}$.

7. The method of claim 1, wherein the metric for the extracted pilot signal is an energy measurement computed over a particular time interval.

8. The method of claim 1, wherein the particular spread spectrum signal is generated in accordance with IS-95-A standard.

9. The method of claim 1, wherein the particular spread spectrum signal includes a pilot signal that is gated in time.

10. A receiver unit configurable to acquire a particular one of a plurality of spread spectrum signals, the receiver unit comprising:
    a receiver configured to receive and condition a received signal to provide a conditioned signal, wherein the received signal includes the particular spread spectrum signal;
    a demodulator coupled to the receiver, the demodulator configured to demodulate the conditioned signal to provide baseband signals;
    a despreader coupled to the demodulator, the despreader configured to despread the baseband signals with a first set of PN sequences to provide despread signals;
    a PN generator coupled to the despreader and configured to provide the first set of PN sequences, wherein the first set of PN sequences is selected from among a plurality of sets of PN sequences and corresponds to a first hypothesis of the particular spread spectrum signal being acquired;
    a processing unit coupled to the despreader, the processing unit configured to process the despread signals to extract a pilot signal and to compute a metric for the extracted pilot signal; and
    a controller coupled to the PN generator and the processing unit, the controller configured to determine whether the pilot signal has been acquired based, in part, on the computed metric and, if the pilot signal is determined to not be acquired, direct the PN generator to provide a second set of PN sequences corresponding to a second hypothesis of the particular spread spectrum signal being acquired, wherein the PN sequences in the second set are uncorrelated to the PN sequences in the first set.

11. The receiver unit of claim 10, wherein the PN sequences for the second set are reverse of the PN sequences for the first set.

12. The receiver unit of claim 10, wherein the PN sequences for the first set are generated based on the following characteristic polynomials:

$P_{1,1}=x^{15}+x^{13}+x^9+x^8+x^7+x^5+1$, and $P_{Q,1}=x^{15}+x^{12}+x^{11}+x^{10}+x^6+x^5+x^4+x^3+1.$ 13. The receiver unit of claim 12, wherein the PN sequences for the second set are generated based on the following characteristic polynomials:

$P_{1,2}=x^{15}+x^{10}+x^8+x^7+x^6+x^2+1$, and $P_{Q,2}=x^{15}+x^{12}+x^{11}+x^{10}+x^9+x^5+x^4+x^3+1.$ 14. The receiver unit of claim 10, wherein the PN generator includes a memory unit configured to store the first set of PN sequences.

15. The receiver unit of claim 14, wherein the memory unit is accessed in a first direction to retrieve the first set of PN sequences and accessed in a second direction to retrieve the second set of PN sequences.

16. The receiver unit of claim 10, wherein the PN generator includes a set of linear feedback shift registers configured to implement a set of characteristic polynomials that define the PN sequences in the first and second set.

17. The receiver unit of claim 10, wherein the particular spread spectrum signal conforms to IS-95-A standard.

* * * * *